(12) United States Patent
Takazawa

(10) Patent No.: US 9,988,736 B2
(45) Date of Patent: Jun. 5, 2018

(54) METHOD FOR GROWING A SILICON SINGLE CRYSTAL WHILE SUPPRESSING A GENERATION OF SLIP DISLOCATIONS IN A TAIL PORTION

(71) Applicant: SHIN-ETSU HANDOTAI CO., LTD., Tokyo (JP)

(72) Inventor: Masanori Takazawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days. days.

(21) Appl. No.: 15/305,119

(22) PCT Filed: Mar. 11, 2015

(86) PCT No.: PCT/JP2015/001319
§ 371 (c)(1),
(2) Date: Oct. 19, 2016

(87) PCT Pub. No.: WO2015/173998
PCT Pub. Date: Nov. 19, 2015

(65) Prior Publication Data
US 2017/0044685 A1  Feb. 16, 2017

(30) Foreign Application Priority Data

May 12, 2014 (JP) .................. 2014-098976

(51) Int. Cl.
C30B 15/22 (2006.01)
C30B 29/06 (2006.01)
C30B 15/20 (2006.01)
(52) U.S. Cl.
CPC ............ *C30B 15/22* (2013.01); *C30B 15/206* (2013.01); *C30B 29/06* (2013.01)

(58) Field of Classification Search
CPC ....... C30B 15/00; C30B 15/20; C30B 15/203; C30B 15/206; C30B 15/22; C30B 29/00;
(Continued)

(56) References Cited

U.S. PATENT DOCUMENTS 6,153,009 A 11/2000 Uesugi et al.
2009/0301385 A1* 12/2009 Kuroki .................. C30B 15/206
117/13

FOREIGN PATENT DOCUMENTS

JP H11-268991 A 10/1999
JP H11-349398 A 12/1999
(Continued)

OTHER PUBLICATIONS

Jun. 9, 2015 International Search Report issued in Patent Application No. PCT/JP2015/001319.

*Primary Examiner* — Kenneth A Bratland, Jr.
(74) *Attorney, Agent, or Firm* — Oliff PLC

(57) ABSTRACT

A method for growing a silicon single crystal includes determining a diameter to give the maximum value of a ratio of an equivalent stress and a critical resolved shear stress in a tail portion on the occasion of the gradual cooling of the silicon single crystal in an after-heating step, in advance; wherein, the tail portion is grown in the tail forming step under a condition that an interstitial oxygen concentration at a position of the determined diameter is $8.8 \times 10^{17}$ atoms/cm$^3$ (ASTM '79) or more. This method for growing a silicon single crystal by a CZ method can efficiently grow a heavy weight and large-diameter silicon single crystal while suppressing a generation of slip dislocations in the tail portion of the silicon single crystal in the after-heating step to gradually cool the crystal after finishing the tail forming step.

9 Claims, 1 Drawing Sheet

(58) Field of Classification Search
CPC ......... C30B 29/02; C30B 29/06; C30B 33/00; C30B 33/02
USPC .............. 117/11, 13–15, 19–20, 30, 35, 928, 117/931–932
See application file for complete search history.

(56) References Cited

FOREIGN PATENT DOCUMENTS

| | | |
|---|---|---|
| JP | 2006-306640 A | 11/2006 |
| JP | 2009-274916 A | 11/2009 |
| JP | 2010-208894 A | 9/2010 |
| JP | 2010-275137 A | 12/2010 |

* cited by examiner

METHOD FOR GROWING A SILICON SINGLE CRYSTAL WHILE SUPPRESSING A GENERATION OF SLIP DISLOCATIONS IN A TAIL PORTION

TECHNICAL FIELD

The present invention relates to a method for growing a silicon single crystal by a Czochralski method (hereinafter, referred to as a CZ method).

BACKGROUND ART

In the conventional manufacturing of silicon single crystal by a CZ method, a small piece of a single crystal silicon is used as a seed crystal, and this is brought into contact with a raw material melt (a silicon melt) and slowly pulled with rotation to grow a silicon single crystal rod (ingot).

In this operation, after the seed crystal is brought into contact with the raw material melt (seeding), the so-called necking is generally performed (Dash Necking method), which forms a tapered necking part to neck the seed crystal and a subsequent neck portion with the diameter being once decreased to about 3 mm, in order to eliminate dislocations produced by propagation of slip dislocations (also referred to as slip simply) generated in the seed crystal at a high density by thermal shock.

After the seed crystal is brought into contact with a raw material melt and is subjected to necking as described above, the single crystal is enlarged to have a desired diameter to form an enlarging diameter portion (also referred to as a cone portion) (a cone forming step). Then, the straight body portion is grown (a straight body forming step), and subsequently, a tail portion is grown while gradually decreasing the diameter of the straight body portion (a tail forming step). The grown silicon single crystal is separated from the melt, and the silicon single crystal is gradually cooled (an after-heating step). By such procedures, dislocation-free silicon single crystals have been grown.

Previously, it has been proposed various technologies to pull such a dislocation-free silicon single crystal.

For example, Patent Document 1 discloses a preferable interstitial oxygen concentration introduced during necking in order to suppress an increase of dislocations in seeding.

In addition, the diameter of a silicon wafer for a semiconductor device has been increased recently, and a wafer with a diameter of 300 mm or more, further with a diameter of 450 mm or more has been highly demanded. Under this circumstance, it has been increasing to manufacture a silicon single crystal for manufacturing a silicon wafer with a diameter of 450 mm.

CITATION LIST

Patent Literature

Patent Document 1: Japanese Unexamined Patent publication (Kokai) No. H11-349398.

SUMMARY OF INVENTION

Technical Problem

Previously, in manufacturing such a large-diameter silicon single crystal, particularly with a diameter of 450 mm or more, a silicon single crystal can be grown without a dislocation until the tail forming step. However, slip dislocations can be subsequently introduced into the grown tail portion in an after-heating step to gradually cool the silicon single crystal after the tail forming step is finished. The introduced slip dislocation can extend to a straight body portion, which is a product portion, thereby causing a problem of severely lowering the productivity.

The present invention was accomplished in view of the above-described problems. It is an object of the present invention to provide a method for growing a silicon single crystal by a CZ method which can grow a heavy weight and large-diameter silicon single crystal in high productivity while suppressing a generation of slip dislocations in the tail portion of the silicon single crystal in an after-heating step to gradually cool the crystal after finishing the tail forming step.

Solution to Problem

To achieve this object, the present invention provides a method for growing a silicon single crystal by a Czochralski method, comprising: bringing a seed crystal into contact with a raw material melt, growing an enlarging-diameter portion in a cone forming step, growing a straight body portion successive to the enlarging-diameter portion in a straight body forming step, decreasing the diameter of the straight body portion gradually to form a tail portion in a tail forming step, separating the silicon single crystal from the melt followed by gradual cooling of the silicon single crystal in an after-heating step to grow the silicon single crystal, and
determining a diameter to give the maximum value of a ratio of an equivalent stress and a critical resolved shear stress in the tail portion on the occasion of the gradual cooling of the silicon single crystal in the after-heating step, in advance; wherein,
the tail portion is grown in the tail forming step under a condition that an interstitial oxygen concentration at a position of the determined diameter is $8.8 \times 10^{17}$ atoms/cm$^3$ (ASTM '79) or more.

In such a method, the interstitial oxygen concentration is controlled as described above, and it is possible to efficiently suppress the generation of slip dislocations in the tail portion in the after-heating step thereby. Accordingly, it is possible to grow a heavy weight and large-diameter silicon single crystal in high productivity.

It is to be noted that in this description, the critical resolved shear stress is also referred to as CRSS, the value of the ratio of an equivalent stress and a critical resolved shear stress (the value of an equivalent stress divided by a critical resolved shear stress) is also referred to as a CRSS ratio.

In this case, the silicon single crystal can be grown in the cone forming step to have a diameter of the enlarging-diameter portion being 450 mm or more.

As described above, the present invention can effectively suppress slip dislocations introduced into the tail portion in the after-heating step in growing a silicon single crystal of a large-diameter, particularly 450 mm or more.

In this case, the silicon single crystal can be grown in the tail forming step to have a length of the tail portion being 450 mm or less.

Under such a condition, slip dislocations introduced into the tail portion of the silicon single crystal in the after-heating step can be suppressed effectively and more securely.

In this case, the after-heating step can be performed with running the after-heating step for 2.5 hours or more, and with the position of the determined diameter being at a height of 186 mm or more from the surface of the melt at the end of the after-heating step.

Under such conditions, slip dislocations introduced into the tail portion of the silicon single crystal in the after-heating step can be suppressed effectively and more securely.

Advantageous Effects of Invention

As described above, when a silicon single crystal is grown by a CZ method, the present invention can suppress slip dislocations introduced into the tail portion in the after-heating step. Accordingly, it is possible to grow a heavy weight and large-diameter silicon single crystal in high productivity.

DESCRIPTION OF EMBODIMENTS

Figure 1:
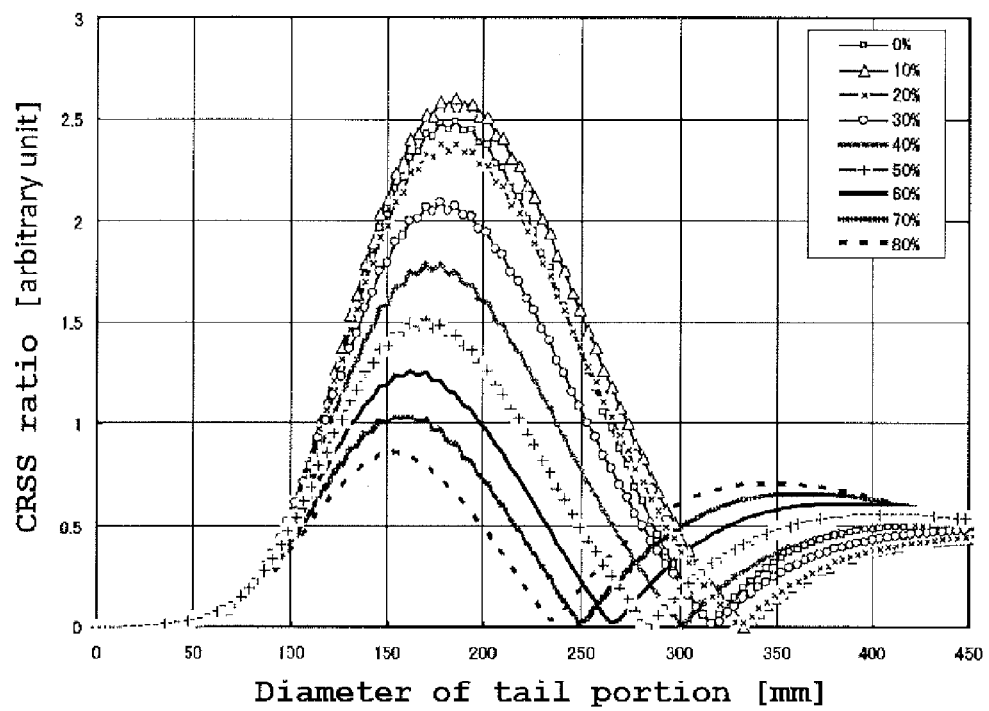
FIG. 1 is a graph to show an example of the distribution of a CRSS ratio (a ratio of an equivalent stress and a critical resolved shear stress) in a crystal growth direction in the after-heating step determined by a numerical analysis.

Hereinafter, the present invention will be described in detail with reference to the drawings and tables, but the present invention is not limited thereto.

As described above, when a large-diameter silicon single crystal, particularly with a diameter of 450 mm or more is grown, a silicon single crystal can be grown without a dislocation until the tail forming step. However, slip dislocations can be introduced into the tail portion of the silicon single crystal in the after-heating step to gradually cool the silicon single crystal after the tail forming step is finished. It has been a problem that the introduced slip dislocation can extend to the straight body portion, which is a product portion, to lower the productivity.

Accordingly, the inventors have diligently investigated on the slip dislocations which are introduced into the tail portion in the after heating step. As a result, it has been found that the starting point to introduce the slip dislocation (also referred to as a slip starting point) is liable to exist at the place of such a diameter as the value of the ratio of an equivalent stress and a critical resolved shear stress in the tail portion is maximum on the occasion of the gradual cooling of the silicon single crystal in the after-heating step.

Accordingly, the inventors have found that it is possible to suppress slip dislocations introduced into the tail portion in the after-heating step by determining a diameter to give the maximum value of a ratio of an equivalent stress and a critical resolved shear stress in the after-heating step, in advance; and growing the tail portion in the tail forming step under a condition that an interstitial oxygen concentration at a position of the determined diameter is $8.8\times10^{17}$ atoms/cm$^3$ (ASTM '79) or more; thereby brought the present invention to completion.

Hereinafter, the inventive method for growing a silicon single crystal will be specifically described.

The inventive method for growing a silicon single crystal is based on a Czochralski method. The apparatus used for manufacturing the silicon single crystal is not particularly limited, and for example, the ones similar to the conventionally used ones can be used. For example, it is possible to adopt a manufacturing apparatus compatible with a MCZ method (Magnetic Field Applied Czochralski method), in which a silicon single crystal is pulled with applying a magnetic field.

(Raw Material Introducing Step)

First, silicon polycrystalline raw material is introduced into a quartz crucible installed in an apparatus.

(Seeding Step)

The raw material is melted with a heater to obtain a raw material melt. Subsequently, a small piece of a silicon single crystal is used as a seed crystal to be brought in contact with the raw material melt, and then slowly pulled while being rotated, thereby growing the silicon single crystal.

In this operation, after the seed crystal is brought into contact with the raw material melt, the so-called necking can be performed (Dash Necking method), which forms a tapered necking part to neck the seed crystal and a subsequent neck portion with the diameter being once decreased to about 3 mm, in order to eliminate dislocations produced by propagation of slip dislocations generated in the seed crystal at a high density by thermal shock.

Alternatively, it is possible to pull a silicon single crystal by applying a dislocation-free seeding method, in which a seed crystal with a pointed edge is prepared and brought in contact with a raw material melt gently to be soaked therein, thereby being pulled after the diameter reaches to a prescribed diameter, instead of the foregoing necking.

(Cone Forming Step)

The diameter of the single crystal is increased to a desired diameter to form an enlarging diameter portion.

In the present invention, the size formed by increasing the diameter of the enlarging diameter portion is not particularly limited, but it is possible to grow to 450 mm or more.

(Straight Body Forming Step)

Subsequent to the enlarging diameter portion, a straight body portion is grown.

(Tail Forming Step)

Prior to start the tail forming step, a diameter to give the maximum value of a ratio, which ratio is an equivalent stress to a critical resolved shear stress in the tail portion on the occasion of the gradual cooling of the silicon single crystal in the after-heating step, is determined in advance. This determination of the diameter have only to be performed before the tail forming step, and can be performed prior to or subsequent to any of the foregoing steps. For example, this diameter can be determined by simulation as will be specifically described below.

Then, the tail portion is grown while decreasing the diameter of the straight body portion gradually.

In this step, the tail portion is grown under a condition that the interstitial oxygen concentration at a position of the determined diameter is $8.8\times10^{17}$ atoms/cm$^3$ (ASTM '79) or more.

This procedure can effectively suppress slip dislocations, which generates at a position where the CRSS ratio is maximum in the after-heating step, and accordingly can efficiently grow a heavy weight and large-diameter silicon single crystal with dislocation-free.

In this case, it is preferable to make the length of the tail portion to 450 mm or less.

This procedure can suppress slip dislocations introduced into the tail portion of the silicon single crystal in an after-heating step effectively and more securely.

The specific method to control the interstitial oxygen concentration at a position of the determined diameter in the tail portion is not particularly limited. For example, it is possible to control the interstitial oxygen concentration at the determined diameter by controlling the pulled silicon single crystal's rotation rate (SR) (i.e., it is also a rotation rate of a seed crystal). Any other methods can be adopted so long as the method can enhance the interstitial oxygen concentration in a silicon single crystal. Illustrative examples of the method include enhancing the crucible's rotation rate (CR) to high rotation speed, lowering the flow rate of Ar gas, enhancing the furnace pressure of a pulling furnace, and introducing quartz material into the quartz crucible. These specific conditions can be determined experimentally.

(After-Heating Step)

Subsequent to grow the tail portion and to separate the silicon single crystal from a raw material melt, the silicon single crystal is gradually cooled while being pulled.

In this case, it is preferable that the set time of the after-heating step be 2.5 hours or more. Furthermore, in the case of this set time, it is preferable to set the pulling speed in such a way that the position of the determined diameter is at a height of 186 mm or more from the surface of the melt at the end of the after-heating step.

This procedure can suppress slip dislocations more securely.

Hereinafter, it will be specifically explained that a slip dislocation is introduced into a position of such a diameter as the value of a ratio of an equivalent stress and a critical resolved shear stress in the tail portion is maximum in the after-heating step with reference to experimental results.

Experiment 1

By using a CZ method, a seed crystal was brought into contact with a raw material melt, and grown to have a diameter of the enlarging-diameter portion of 450 mm. Subsequent to the enlarging-diameter portion, a straight body portion was grown, and then a tail portion was grown until the length becomes to 350 mm. The silicon single crystal was separated from the melt. In the subsequent after-heating step, plural of silicon single crystals were grown at a pulling rate of 0.5 mm/min for an after-heating time of 5 hours.

In the tail portion of the formed silicon single crystal, slip dislocations were generated in the after-heating step. In this case, the position of the generated slip dislocation (referred to as a slip starting point), the interstitial oxygen concentration at the slip starting point, and the generation rate of slip dislocation were determined. These results are shown in Table 1. Herein, the generation rate of slip dislocation is a value to represent a ratio of the number of silicon single crystals in which slip dislocation was generated based on the number of grown silicon single crystals.

As shown in Table 1, it was found that the starting point of slip dislocation was at a position where the diameter of the tail portion was 185 mm in every silicon single crystal. The generation rates of slip dislocation were extremely high as 85 to 100%.

The inventers have supposed that the slip dislocations introduced into each tail portion was generated due to thermal stress in a process of gradual cooling of the silicon single crystal in the after-heating step since the slip dislocation was generated in the tail portion of each silicon single crystal in the after-heating step, not in the tail forming step.

Accordingly, the inventors performed the following Experiment 2 in order to investigate whether the slip dislocation introduced into the tail portion in the after-heating step was due to thermal stress or not when the silicon single crystal was cooled generally in the after-heating step.

Experiment 2

Numerical analyses were performed on the cases of growing each silicon single crystal under the condition in Experiment 1 (the length of the tail portion: 350 mm, the pulling rate: 0.5 mm/min, the set time of the after-heating: 5 hours).

The inventors performed the numerical analysis as follows.

First, temperature distribution in a silicon single crystal was determined by global heat transfer analysis with FEMAG (global heat transfer analysis software: F. Dupret, P. Nicodeme, Y. Ryckmans, P. Wouters, and M. J. Crochet, Int. J. Heat Mass Transfer, 33, 1649 (1990)). Then, stress analysis was performed on the basis of this temperature distribution with considering gravity by use of ANSYS (manufactured by ANSYS Inc., USA) to determine an equivalent stress in a silicon single crystal. This value was divided by a critical resolved shear stress (CRSS) having temperature dependence to calculate distribution of this value (CRSS ratio) in a crystal growth direction. Such a simulation analysis method was adopted because it is not possible to evaluate the tendency of a silicon single crystal to generate dislocations by comparing the equivalent stresses alone since a silicon single crystal in the middle of pulling has temperature distribution therein.

As a result of performing numerical analyses as described above, FIG. 1 was obtained. The legend shows the ratio of each elapsed time based on the set time of the after-heating. As shown in FIG. 1, it has been found that the CRSS ratio (also referred to as a CRSS ratio-peak value) is maximum in the after-heating step at a position where the diameter of the tail portion is 185 mm. This result coincides with the result that the starting point of slip dislocation was at a position where the diameter of the tail portion was 185 mm, which was determined by Experiment 1. These results have

TABLE 1

| Length of tail portion [mm] | Pulling rate of after-heating [mm/min] | Set time of after-heating [hours] | Height of slip starting point from melt | | Interstitial oxygen concentration atoms/cm$^3$ (ASTM '79) | Diameter at slip starting point [mm] | Generation rate of slip dislocation % |
|---|---|---|---|---|---|---|---|
| | | | at Start of after-heating [mm] | at End of after-heating [mm] | | | |
| 350 | 0.5 | 5.0 | 142 | 292 | $6.4 \times 10^{17}$ | 185 | 100 |
| | | | | | $7.2 \times 10^{17}$ | 185 | 100 |
| | | | | | $8.0 \times 10^{17}$ | 185 | 85 | revealed that slip dislocation is introduced by heat stress into a position of such a diameter as the CRSS ratio in the tail portion of a silicon single crystal is maximum in the after-heating step.

Accordingly, in the present invention, it has been aimed to suppress introduction of slip dislocations into the tail portion in the after-heating step after a defect-free growth of the tail portion by applying the effect of oxygen contained in a silicon single crystal as an impurity to enhance the strength of the silicon single crystal and to suppress generation of slip dislocations in the silicon single crystal.

EXAMPLE

Hereinafter, the present invention will be described in more detail with reference to Examples and Comparative Example, but the present invention is not limited thereto.

Example 1

By a CZ method, a cone forming step, a straight body forming step, and a tail forming step is subjected from a raw material melt in a quartz crucible, and then an after-heating step is subjected to obtain plural of silicon single crystals.

The silicon single crystals were pulled through being subjected to the straight body forming step to have the straight body portion with a diameter of 450 mm, the tail forming step to have the tail portion with a length of 350 mm, and the after-heating step at the pulling rate of 0.5 mm/min for the set time of 5.0 hours.

On the other hand, a numerical analysis was performed previously to determine the diameter of the tail portion where the CRSS ratio in the tail portion is maximum in the after-heating step. As the result, it has been determined that the CRSS ratio is maximum in the after-heating step at a position where the diameter of the tail portion is 185 mm.

In Examples, the rotation rates of the silicon single crystal and the quartz crucible were adjusted in the tail forming step to control the interstitial oxygen concentration at the position of such a diameter of the tail portion as the CRSS ratio in the tail portion is maximum in the after-heating step. In Example 1, specifically, the tail forming step was performed by controlling the interstitial oxygen concentration at the determined position to be 8.8×10$^{17}$ [atoms/cm$^3$ (ASTM '79)] or more such as 8.8×10$^{17}$, 9.6×10$^{17}$, 11.2×10$^{17}$, and 12.8×10$^{17}$. Table 2 shows results obtained under the foregoing conditions.

TABLE 2

| Pulling | | | Height from melt to position of diameter of tail portion at CRSS ratio-peak value | | Interstitial | Generation rate of |
|---|---|---|---|---|---|---|
| Length of tail portion [mm] | rate of after-heating [mm/min] | Set time of after-heating [hours] | at Start of after-heating [mm] | at End of after-heating [mm] | oxygen concentration atoms/cm$^3$ (ASTM '79) | slip dislocation % |
| 350 | 0.5 | 5.0 | 142 | 292 | 8.8 × 10$^{17}$ | 0 |
| | | | | | 9.6 × 10$^{17}$ | 0 |
| | | | | | 11.2 × 10$^{17}$ | 0 |
| | | | | | 12.8 × 10$^{17}$ | 0 |

As shown in Table 2, the generation rate of slip dislocation in the silicon single crystal grown under the foregoing conditions was 0% in every case, which was very favorable compared to Comparative Example.

Example 2

Silicon single crystals were grown in the same manner as in Example 1 except that the tail forming step was performed with varying the length of the tail portion from 350 to 460 mm, while controlling the interstitial oxygen concentration at the position of such a diameter of the tail portion as the CRSS ratio in the tail portion is maximum in the after-heating step to be 8.8×10$^{17}$ [atoms/cm$^3$ (ASTM '79)] in the tail forming step.

Figure 2:
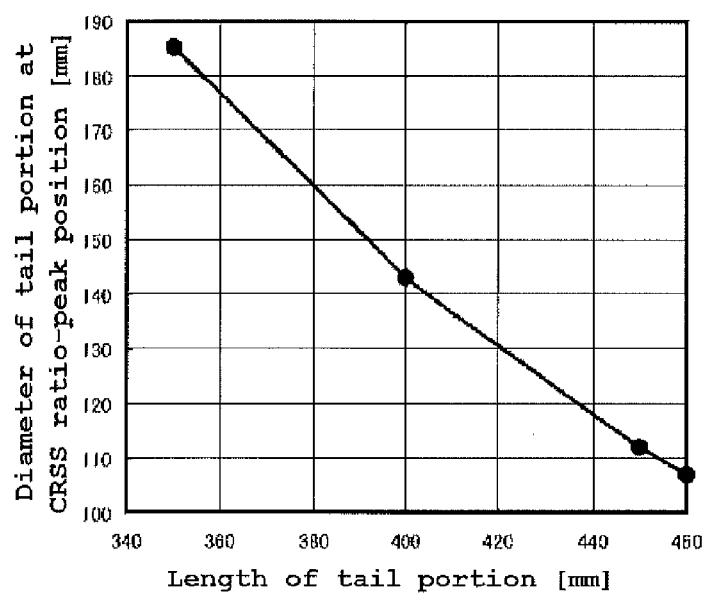
FIG. 2 is a graph to show an example of the relationship between the length of the tail portion and the diameter of the tail portion at the CRSS ratio (a ratio of an equivalent stress and a critical resolved shear stress)-peak position.

The relationship between the length of the tail portion and the diameter of the tail portion at the CRSS ratio-peak position was determined by numerical analyses, and shown in FIG. 2. As shown in FIG. 2, it has been revealed that the value of a diameter of the tail portion at the CRSS ratio-peak position is changed when the length of the tail portion is varied.

Table 3 shows results obtained under the foregoing conditions.

TABLE 3

| Length of tail portion [mm] | Pulling rate of after-heating [mm/min] | Set time of after-heating [hours] | Diameter at CRSS ratio-peak [mm] | Height from melt to position of diameter of tail portion at CRSS ratio-peak value | | CRSS ratio-peak value [arbitrary unit] | Interstitial oxygen concentration atoms/cm$^3$ (ASTM '79) | Generation rate of slip dislocation % |
|---|---|---|---|---|---|---|---|---|
| | | | | at Start of after-heating [mm] | at End of after-heating [mm] | | | |
| 350 | 0.5 | 5.0 | 185.0 | 142.0 | 292.0 | 2.49 | 8.8 × 10$^{17}$ | 0 |
| 400 | | | 143.0 | 125.4 | 275.4 | 2.56 | 8.8 × 10$^{17}$ | 0 |
| 450 | | | 112.0 | 111.0 | 261.0 | 2.63 | 8.8 × 10$^{17}$ | 0 |
| 460 | | | 107.0 | 108.0 | 258.0 | 2.68 | 8.8 × 10$^{17}$ | 10.2 |

As shown in Table 3, the generation rates of slip could be suppressed to lower values by controlling the interstitial oxygen concentration at the position of such a diameter of the tail portion as the CRSS ratio is maximum to be $8.8 \times 10^{17}$ atoms/cm$^3$ (ASTM '79). In these cases, an introduction of slip dislocation into each tail portion could be suppressed more securely in the after-heating step by setting the length of the tail portion to 450 mm or less. However, it is needless to say that better results can be obtained compared to the previous arts even when the growth is performed under a condition in which the length of the tail portion is more than 450 mm such as 460 mm.

Example 3

Each tail forming process was performed with varying the length of the tail portion in a range of 350 to 450 mm, while controlling the interstitial oxygen concentration at the position of such a diameter of the tail portion as the CRSS ratio in the tail portion is maximum in the after-heating step to be $8.8 \times 10^{17}$ [atoms/cm$^3$ (ASTM '79)] in the tail forming step. In the after-heating step, the set time of after-heating was varied in a range of 1.0 to 4.0 hours to change the height from the melt to the position of the diameter of the tail portion at the CRSS ratio-peak position at the end of the after-heating step. Silicon single crystals were grown in the same manner as in Example 1 other than the foregoing conditions.

Table 4 shows results obtained under the foregoing conditions.

TABLE 4

| Length of tail portion [mm] | Pulling rate of after-heating [mm/min] | Set time of after-heating [hours] | Diameter at CRSS ratio-peak [mm] | Height from melt to position of diameter of tail portion at CRSS ratio-peak value | | CRSS ratio-peak value [arbitrary unit] | Interstitial oxygen concentration atoms/cm$^3$ (ASTM '79) | Generation rate of slip dislocation % |
|---|---|---|---|---|---|---|---|---|
| | | | | at Start of after-heating [mm] | at End of after-heating [mm] | | | |
| 350 | 0.5 | 1.0 | 185.0 | 142.0 | 172.0 | 2.49 | $8.8 \times 10^{17}$ | 10.9 |
| 400 | | | 143.0 | 125.4 | 155.4 | 2.56 | $8.8 \times 10^{17}$ | 10.1 |
| 450 | | | 112.0 | 111.0 | 141.0 | 2.63 | $8.8 \times 10^{17}$ | 9.2 |
| 350 | 0.5 | 2.5 | 185.0 | 142.0 | 217.0 | 2.49 | $8.8 \times 10^{17}$ | 0 |
| 400 | | | 143.0 | 125.4 | 200.4 | 2.56 | $8.8 \times 10^{17}$ | 0 |
| 450 | | | 112.0 | 111.0 | 186.0 | 2.63 | $8.8 \times 10^{17}$ | 0 |
| 350 | 0.5 | 4.0 | 185.0 | 142.0 | 262.0 | 2.49 | $8.8 \times 10^{17}$ | 0 |
| 400 | | | 143.0 | 125.4 | 245.4 | 2.56 | $8.8 \times 10^{17}$ | 0 |
| 450 | | | 112.0 | 111.0 | 231.0 | 2.63 | $8.8 \times 10^{17}$ | 0 |

As shown in Table 4, an introduction of slip dislocation into each tail portion could be suppressed more securely in the after-heating step with the set time of the after-heating step being set to 2.5 hours or more, and further, with the distance from the melt to the position of a diameter to give the maximum CRSS ratio in the after-heating step being set to 186.0 mm or more. However, it is needless to say that better results can be obtained compared to the previous arts even when the growth is performed under a condition in which the set time of the after-heating step is less than 2.5 hours (e.g., 1.0 hour in Table 4) or the distance from the melt to the position of the diameter to give the maximum CRSS ratio is less than 186.0 mm (e.g., 172.0 mm in Table 4).

Comparative Example

In Comparative Example, plural of silicon single crystals were grown by a CZ method in the same manner as in Example 1, while without particularly considering the interstitial oxygen concentration in the tail portion as in Example 1. Silicon single crystals were grown to have the tail portion with a length of 350 mm at a pulling rate in after-heating of 0.5 mm/min for a set time of after-heating of 5.0 hours. These results are shown in Table 5.

TABLE 5

| Length of tail portion [mm] | Pulling rate of after-heating [mm/min] | Set time of after-heating [hours] | Height of slip starting point from melt | | Interstitial oxygen concentration atoms/cm$^3$ (ASTM '79) | Generation rate of slip dislocation % |
|---|---|---|---|---|---|---|
| | | | at Start of after-heating [mm] | at End of after-heating [mm] | | |
| 350 | 0.5 | 5.0 | 142 | 292 | $6.4 \times 10^{17}$ | 100 |
| | | | | | $7.2 \times 10^{17}$ | 100 |
| | | | | | $8.0 \times 10^{17}$ | 85 |

As shown in Table 5, as a result of growing each silicon single crystal under the foregoing conditions, slip dislocations were introduced in the after-heating step. Each of the positions was at a position with the diameter of 185 mm in the tail portion.

In the position where slip dislocations were introduced in the tail portion, each interstitial oxygen concentration was less than $8.8 \times 10^{17}$ atoms/cm$^3$ (ASTM '79) as shown in Table 5, which differed from Example 1. As a result, the generation rates of slip dislocation were from 85% to 100% as shown in Table 5, which were worse compared to Example 1.

In a tailing step, the amount of silicon melt in a quartz crucible gets fewer, and the contact area of the quartz crucible and the silicon melt gets smaller thereby. In addition to that, due to a decrease of the crystal diameter, the area of a free melt surface is enlarged to increase evaporation of oxygen in the melt, and the oxygen concentration in the melt decreases thereby. Accordingly, in general, the oxygen concentration in the tail portion of a single crystal is extremely low compared to the straight body portion. The present invention has improved this point to increase the oxygen concentration in the tail portion, and have succeeded to suppress generation of slip dislocations thereby.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for growing a silicon single crystal by a Czochralski method, comprising: bringing a seed crystal into contact with a raw material melt, growing an enlarging-diameter portion in a cone forming step, growing a straight body portion successive to the enlarging-diameter portion in a straight body forming step, decreasing the diameter of the straight body portion gradually to form a tail portion in a tail forming step, separating the silicon single crystal from the melt followed by gradual cooling of the silicon single crystal in an after-heating step to grow the silicon single crystal, and determining a diameter to give the maximum value of a ratio of an equivalent stress and a critical resolved shear stress in the tail portion on the occasion of the gradual cooling of the silicon single crystal in the after-heating step, in advance; wherein, the tail portion is grown in the tail forming step under a condition that an interstitial oxygen concentration at a position of the determined diameter is $8.8 \times 10^{17}$ atoms/cm$^3$ (ASTM '79) or more.

2. The method for growing a silicon single crystal according to claim 1, wherein the silicon single crystal is grown in the cone forming step to have a diameter of the enlarging-diameter portion being 450 mm or more.

3. The method for growing a silicon single crystal according to claim 1, wherein the silicon single crystal is grown in the tail forming step to have a length of the tail portion being 450 mm or less.

4. The method for growing a silicon single crystal according to claim 2, wherein the silicon single crystal is grown in the tail forming step to have a length of the tail portion being 450 mm or less.

5. The method for growing a silicon single crystal according to claim 1, wherein the after-heating step runs for 2.5 hours or more, and the after-heating step is performed with the position of the determined diameter being at a height of 186 mm or more from the surface of the melt at the end of the after-heating step.

6. The method for growing a silicon single crystal according to claim 2, wherein the after-heating step runs for 2.5 hours or more, and the after-heating step is performed with the position of the determined diameter being at a height of 186 mm or more from the surface of the melt at the end of the after-heating step.

7. The method for growing a silicon single crystal according to claim 3, wherein the after-heating step runs for 2.5 hours or more, and the after-heating step is performed with the position of the determined diameter being at a height of 186 mm or more from the surface of the melt at the end of the after-heating step.

8. The method for growing a silicon single crystal according to claim 4, wherein the after-heating step runs for 2.5 hours or more, and the after-heating step is performed with the position of the determined diameter being at a height of 186 mm or more from the surface of the melt at the end of the after-heating step.

9. The method for growing a silicon single crystal according to claim 1, wherein the diameter to give the maximum value of the ratio of the equivalent stress and the critical resolved shear stress in the tail portion is determined by simulation.

* * * * *